(12) United States Patent
Park et al.

(10) Patent No.: US 9,825,257 B2
(45) Date of Patent: Nov. 21, 2017

(54) LIGHT EXTRACTION SUBSTRATE FOR OLED AND METHOD OF FABRICATING THE SAME

(71) Applicant: Samsung Corning Precision Materials Co., Ltd., Gyeongsangbuk-do (KR)

(72) Inventors: June Hyoung Park, ChungCheongNam-Do (KR); Young Zo Yoo, ChungCheongNam-Do (KR); Tae Jung Park, ChungCheongNam-Do (KR); Seo Hyun Kim, ChungCheongNam-Do (KR); Il Hee Baek, ChungCheongNam-Do (KR); Gun Sang Yoon, ChungCheongNam-Do (KR); Eun Ho Choi, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 73 days.

(21) Appl. No.: 13/914,916

(22) Filed: Jun. 11, 2013

(65) Prior Publication Data
US 2013/0330505 A1    Dec. 12, 2013

(30) Foreign Application Priority Data

Jun. 12, 2012    (KR) .......................... 10-2012-0062738

(51) Int. Cl.
*H01L 51/52*    (2006.01)
*H01L 51/54*    (2006.01)
(Continued)

(52) U.S. Cl.
CPC ............ *H01L 51/5268* (2013.01); *B32B 3/30* (2013.01); *B32B 5/145* (2013.01); *B32B 7/005* (2013.01);
(Continued)

(58) Field of Classification Search
CPC ..................... H01L 31/02366; H01L 51/5268
See application file for complete search history.

(56) References Cited

U.S. PATENT DOCUMENTS 6,010,747 A *  1/2000  Beeson ............... G02B 5/0215
                                                        264/119
8,237,158 B2 *  8/2012  Chao ................... H01L 51/5076
                                                        257/103
(Continued)

FOREIGN PATENT DOCUMENTS

JP       2010102965 A  *  5/2010

OTHER PUBLICATIONS

Machine translation of JP2010/102965 A, obtained from Industrial Property Digital Library of the JPO on Feb. 13, 2016.*

*Primary Examiner* — Aaron Austin
*Assistant Examiner* — Zheren J Yang
(74) *Attorney, Agent, or Firm* — Lerner, David, Littenberg, Krumholz & Mentlik, LLP

(57) ABSTRACT

A light extraction substrate for an organic light-emitting device (OLED) which can improve the brightness of a display or an illumination system to which an OLED is applied by improving light extraction efficiency and a method of manufacturing the same. The light extraction substrate for an OLED includes an oxide or nitride thin film formed on a substrate body. The oxide or nitride thin film includes a base layer formed on the substrate body, a first texture formed on the base layer, the first texture having a plurality of first protrusions which protrude continuously or discontinuously from the base layer, and a second texture having a plurality of second protrusions which protrude continuously or discontinuously from each outer surface of the first protrusions.

13 Claims, 8 Drawing Sheets

(51) Int. Cl.
*B32B 3/30* (2006.01)
*B32B 7/00* (2006.01)
*B32B 5/14* (2006.01)

(52) U.S. Cl.
CPC .. *Y10T 428/2462* (2015.01); *Y10T 428/24273* (2015.01); *Y10T 428/24355* (2015.01); *Y10T 428/24521* (2015.01); *Y10T 428/24545* (2015.01); *Y10T 428/24595* (2015.01); *Y10T 428/24612* (2015.01)

(56) References Cited

U.S. PATENT DOCUMENTS

| | | | | |
|---|---|---|---|---|
| 8,916,892 | B2* | 12/2014 | Jo | H01L 27/1218 257/98 |
| 9,257,312 | B2* | 2/2016 | Yoo | H01L 21/64 |
| 2001/0033135 | A1* | 10/2001 | Duggal | B82Y 20/00 313/506 |
| 2002/0022148 | A1* | 2/2002 | Yudasaka | H01L 51/5262 428/690 |
| 2004/0027062 | A1* | 2/2004 | Shiang | H01L 51/5262 313/506 |
| 2004/0263061 | A1* | 12/2004 | Ishikawa | G02B 5/045 313/501 |
| 2005/0007000 | A1* | 1/2005 | Chou | H01L 27/156 313/116 |
| 2006/0268418 | A1* | 11/2006 | Kim | G02B 6/0053 359/618 |
| 2007/0019131 | A1* | 1/2007 | Choi | G02B 5/0215 349/65 |
| 2007/0188861 | A1* | 8/2007 | Kim | G02B 3/0056 359/455 |
| 2007/0201056 | A1* | 8/2007 | Cok | B82Y 20/00 358/1.9 |
| 2008/0088933 | A1* | 4/2008 | Lin | G02B 5/045 359/599 |
| 2008/0182076 | A1* | 7/2008 | Kondo | G02F 1/133606 428/172 |
| 2008/0203421 | A1* | 8/2008 | Bechtel | H01L 33/22 257/99 |
| 2008/0232135 | A1* | 9/2008 | Kinder | G02B 6/0053 362/615 |
| 2009/0015757 | A1* | 1/2009 | Potts | B82Y 20/00 349/69 |
| 2009/0162623 | A1* | 6/2009 | Foresti | B29C 59/046 428/210 |
| 2009/0226628 | A1* | 9/2009 | Lu | G02B 5/0221 427/510 |
| 2009/0323329 | A1* | 12/2009 | Lin | F21K 9/00 362/235 |
| 2010/0006862 | A1* | 1/2010 | Cheng | H01L 33/22 257/79 |
| 2010/0027242 | A1* | 2/2010 | Kishine | G02B 5/045 362/97.1 |
| 2010/0116332 | A1* | 5/2010 | Counil | H01L 31/0236 136/256 |
| 2010/0126575 | A1* | 5/2010 | Bailat | H01L 31/022466 136/256 |
| 2010/0177384 | A1* | 7/2010 | Peroz | C03C 1/008 359/485.01 |
| 2010/0278480 | A1* | 11/2010 | Vasylyev | G02B 3/005 385/33 |
| 2011/0170184 | A1* | 7/2011 | Wolk | G02B 27/2214 359/463 |
| 2011/0211337 | A1* | 9/2011 | Ito | G02B 19/0028 362/97.1 |
| 2011/0220197 | A1* | 9/2011 | Myong | H01L 31/022425 136/256 |
| 2011/0228551 | A1* | 9/2011 | Verschuren | G02B 6/0035 362/555 |
| 2011/0281068 | A1* | 11/2011 | David | G02B 1/118 428/141 |
| 2011/0290322 | A1* | 12/2011 | Meguro | H01L 31/022466 136/256 |
| 2012/0080085 | A1* | 4/2012 | Honeker | B32B 3/28 136/256 |
| 2012/0098421 | A1* | 4/2012 | Thompson | B32B 27/08 313/512 |
| 2012/0118362 | A1* | 5/2012 | Matsui | H01L 31/022466 136/252 |
| 2012/0126689 | A1* | 5/2012 | Gaerditz | B82Y 20/00 313/504 |
| 2012/0156436 | A1* | 6/2012 | Kim | C09K 11/565 428/172 |
| 2012/0206923 | A1* | 8/2012 | Tanaka | B29C 44/0438 362/326 |
| 2012/0223635 | A1* | 9/2012 | Mochizuki | H01L 51/5268 313/512 |
| 2012/0248970 | A1* | 10/2012 | Okuyama | H01L 51/5268 313/504 |
| 2012/0255673 | A1* | 10/2012 | Stouwdam | H01L 51/5212 156/241 |
| 2012/0258285 | A1* | 10/2012 | Cheng | C30B 25/18 428/156 |
| 2012/0261701 | A1* | 10/2012 | Yoo | H01L 51/5275 257/98 |
| 2012/0270013 | A1* | 10/2012 | Kim | H01L 31/022483 428/141 |
| 2013/0057137 | A1* | 3/2013 | Zijp | F21K 9/00 313/110 |
| 2013/0213465 | A1* | 8/2013 | Park | H01L 31/02366 136/256 |
| 2013/0264555 | A1* | 10/2013 | Ishibashi | G02B 5/0236 257/40 |
| 2013/0285540 | A1* | 10/2013 | Jo | H05B 33/06 313/504 |
| 2014/0042422 | A1* | 2/2014 | Silverman | H01L 51/5275 257/40 |
| 2014/0042476 | A1* | 2/2014 | Yoo | H01L 33/405 257/98 |
| 2015/0048380 | A1* | 2/2015 | Koike | H01L 33/22 257/76 |
| 2015/0076468 | A1* | 3/2015 | Yamaguchi | G02B 1/118 257/40 |

* cited by examiner ent Application Number 10-2012-0062738 filed on Jun. 12, 2012, the entire contents of which application are incorporated herein for all purposes by this reference.

LIGHT EXTRACTION SUBSTRATE FOR OLED AND METHOD OF FABRICATING THE SAME

CROSS REFERENCE TO RELATED APPLICATION

The present application claims priority from Korean Patent Application Number 10-2012-0062738 filed on Jun. 12, 2012, the entire contents of which application are incorporated herein for all purposes by this reference.

BACKGROUND OF THE INVENTION

Field of the Invention

The present invention relates to a light extraction substrate for an organic light-emitting device (OLED) and a method of fabricating the same, and more particularly, to a light extraction substrate for an OLED which can improve the brightness of a display or an illumination system to which an OLED is applied by improving light extraction efficiency and a method of manufacturing the same.

Description of Related Art

In general, an organic light-emitting device (OLED) includes an anode, a light-emitting layer and a cathode. When a voltage is applied between the anode and the cathode, holes are injected from the anode into the organic light-emitting layer and electrons are injected from the cathode into the organic light-emitting layer. Holes and electrons that have migrated into the organic light-emitting layer recombine with each other in the organic light-emitting layer, thereby generating excitons. When such excitons transit from the excited state to the ground state, light is emitted.

Organic light-emitting displays including an OLED are divided into a passive matrix type and an active matrix type depending on a mechanism that drives an N*M number of pixels which are arranged in the shape of a matrix.

In the active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. In addition, the active matrix type organic light-emitting display consumes little power, and thus can be advantageously applied to high definition displays and large displays. In contrast, the passive matrix type is configured such that a current is directly applied to each pixel. Although the passive matrix type is simpler than the active matrix type, it is not suitable for a high-definition display. Therefore, the passive matrix type is generally used for small displays or illumination systems.

However, although OLEDs are in the stage of commercial distribution, light loss still occurs at the interface between the thin film layer of the device and the substrate due to the difference between refractive indexes. Accordingly, the light extraction efficiency of OLEDs is limited to about 20%, which is problematic. It is difficult for OLEDs to realize a high efficiency without improving the light extraction efficiency.

In order to overcome this problem, an approach of improving an optical efficiency by forming a light extraction layer on an OLED was proposed. In the related art, such light extraction layers were formed via photolithography. However, there are the following problems in that a cost is increased due to the use of expensive equipment and a process becomes complicated, which is problematic.

In addition, the light extraction layer was formed by patterning a polymeric plastic film and then attaching the patterned film on an OLED. However, there are limitations not only to an increase in the refractive index of the polymeric plastic material but also to the mechanical and thermal endurance of the material.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a light extraction substrate for an organic light-emitting device (OLED) which can improve the brightness of a display or an illumination system to which an OLED is applied by improving light extraction efficiency and a method of manufacturing the same.

In an aspect of the present invention, provided is a light extraction substrate for an OLED. The light extraction substrate includes an oxide or nitride thin film formed on a substrate body. The oxide or nitride thin film includes a base layer formed on the substrate body; a first texture formed on the base layer, the first texture having a plurality of first protrusions which protrude continuously or discontinuously from the base layer; and a second texture having a plurality of second protrusions which protrude continuously or discontinuously from each outer surface of the first protrusions.

According to an embodiment of the present invention, the refractive index of the oxide or nitride thin film may be greater than the refractive index of the substrate body.

The thickness of the oxide or nitride thin film may range from 1 to 12 µm.

The thickness of the base layer may be 25% or less of the thickness of the first texture.

The base layer may have fewer voids therein than the first texture.

The oxide or nitride thin film may be made of one selected from the group consisting of ZnO, $TiO_2$, $SnO_2$, $SrTiO_3$, $VO_2$, $V_2O_3$, $SrRuO_3$, $Si_3N_4$, SiN, TiN, $SiO_2$, and mixtures thereof.

The oxide or nitride thin film may include a dopant of at least one selected from a metal group consisting of Mg, Cd, S, Se, Te, F, Ga, Al, Mn, Co, Cu, Nb, Nd, Sr, W and Fe.

The light extraction substrate may have an average transmittance of 40% or greater in a wavelength range from 380 to 800 nm.

The thickness of the base layer may range from 0.01 to 1 µm.

The height of the first protrusions may range from 0.05 to 10 µm.

The pitch of the first protrusions may be 10 µm or less.

The shortest width of the first protrusions may range from 0.05 to 5 µm, and the width of the first protrusions orthogonal to the shortest width may range from 0.05 to 10 µm.

The pitch of the second protrusions may range from 0.01 to 1 µm, and the height of the second protrusions may range from 0.01 to 1 µm.

In another aspect of the present invention, provided is a method of manufacturing a light extraction substrate. The method includes the step of forming a light extraction layer on a substrate body via atmospheric pressure chemical vapor deposition (APCVD), the light extraction layer being implemented as an oxide or nitride thin film. The light extraction layer includes a base layer on the substrate body, a first texture having a plurality of first protrusions which protrude continuously or discontinuously from the base layer, and a second texture having a plurality of second protrusions which protrude continuously or discontinuously from each outer surface of the first protrusions.

According to an embodiment of the present invention, the method may further include the step of treating the substrate body with plasma or a chemical before the step of forming the light extraction layer via APCVD.

According to an embodiment of the present invention, the method may further include the step of treating the light extraction layer with plasma or a chemical after the step of forming the light extraction layer via APCVD.

According to embodiments of the present invention, it is possible to improve the light extraction efficiency by providing a light extraction substrate in which textures having different sizes and shapes are formed on multiple layers. Accordingly, it is possible to improve the brightness of a display or an illumination system to which an OLED is applied.

In addition, it is possible to naturally form a texture on the surface of a light extraction layer which is formed by APCVD, thereby making the process simpler than in the related art.

Furthermore, it is possible to realize an OLED that is inexpensive and is highly efficient.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
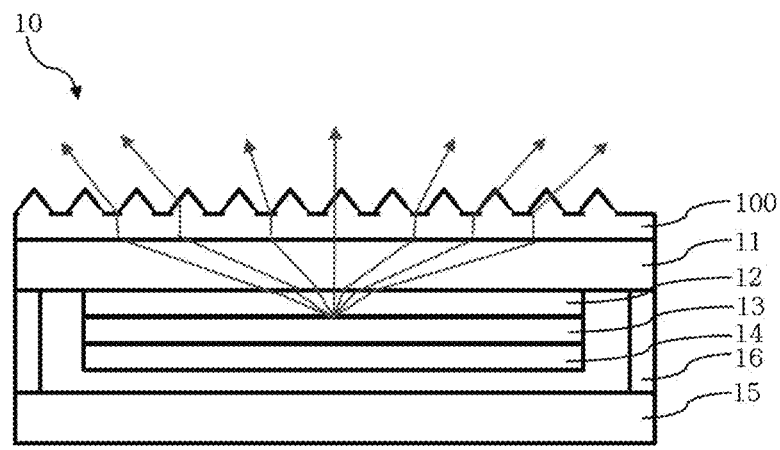
FIG. 1 is a configuration view schematically showing an organic light-emitting device (OLED) having a light extraction substrate according to an embodiment of the present invention.

Reference will now be made in detail to a light extraction substrate for an organic light-emitting device (OLED) and a method of fabricating the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Referring to FIG. 1, a light extraction substrate for an organic light-emitting device (OLED) according to an embodiment of the present invention is a functional thin film substrate that improves the light extraction efficiency of an OLED 10 in order to improve the brightness of a display or an illumination system to which the OLED 10 is applied. The light extraction substrate is disposed on the front surface of the OLED 10, and serves to protect the OLED 10 from external environments and acts as a path through which light generated by the OLED 10 is emitted to the outside. In addition, the light extraction substrate according to an embodiment of the present invention has a surface shape on which a texture is formed. In addition, the light extraction substrate according to an embodiment of the present invention can be implemented as an oxide or nitride thin film substrate, in particular, as an oxide or nitride thin film substrate having a wide band gap of 2.8 eV or greater. This is because the transparency of the oxide or nitride thin film increases as the size of the band gap increases. The oxide or nitride thin film having such a wide band gap can be made of one selected from among a group of substances consisting of ZnO, $TiO_2$, $SnO_2$, $SrTiO_3$, $VO_2$, $V_2O_3$, $SrRuO_3$ and $SiO_2$ and mixtures thereof. Here, the oxide or nitride thin film can include a dopant of at least one selected from a metal group consisting of Mg, Cd, S, Se, Te, F, Ga, Al, Mn, Co, Cu, Nb, Nd, Sr, W and Fe. For instance, when the oxide is ZnO, the dopant can be a metal, a transition metal or a halogen element, such as Mg, Cd, S, Ga, Al, F, Mn, Co, Cu or so on. In addition, when the oxide is $TiO_2$, the dopant can be Nb, Nd or Sr. When the oxide is $SnO_2$, the dopant can be F. When the oxide is $SrTiO_2$, the dopant can be Nd. When the oxide is $VO_2$, the dopant can be W. When the oxide is $SrRuO_3$, the dopant can be a transition metal such as Fe or Co. Here, the dopants can be used alone or in a combination of at least two thereof in order to adjust the band gap and the refractive index of each oxide or nitride and to control the surface shape of each oxide or nitride, i.e. to control the shape of the textures. Here, it is preferred that the dopant be added at a content, by weight, of 10 percent or less of the content of the oxide or nitride. The dopant can be added during or after the process of forming a light extraction layer 100 depending on process conditions. It is preferred that the refractive index of the light extraction layer 100 formed as an oxide or nitride thin film be greater than the refractive index of a substrate body 11.

As shown in the figure, the OLED 10 includes the substrate body 11 which is a component of the light extraction substrate and serves as a front substrate. The OLED 10 also includes a rear substrate 15 which is disposed such that it faces the substrate body 11, first and second electrode layers 12 and 14 which are disposed between the front substrate (substrate body 11) and the rear substrate 15, an organic light-emitting layer 13 which is disposed between the first and second electrode layers 12 and 14, and a sealant 16 which is disposed on the periphery of the front substrate (substrate body 11) and the rear substrate 15 and in the space between the front substrate (substrate body 11) and the rear substrate 15 in order to protect the first and second electrode layers 12 and 14 and the organic light-emitting layer 13 from external environments.

Figure 2:
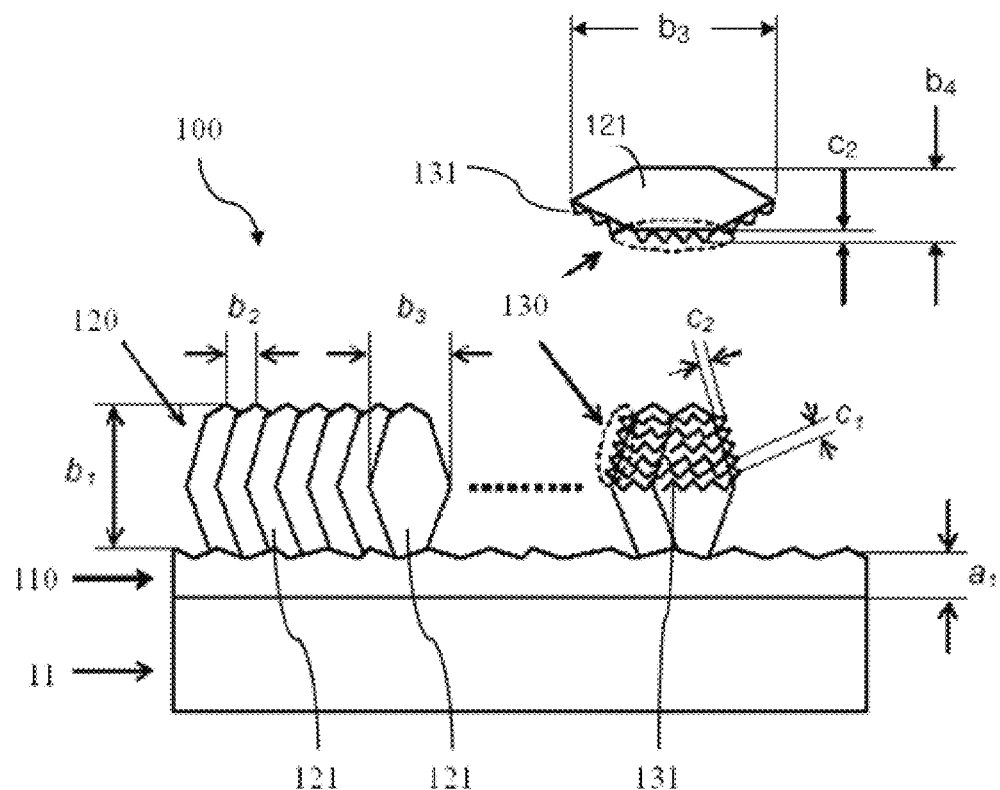
FIG. 2 is a view showing the surface shape of a light extraction substrate according to an embodiment of the present invention.
Figure 3A:
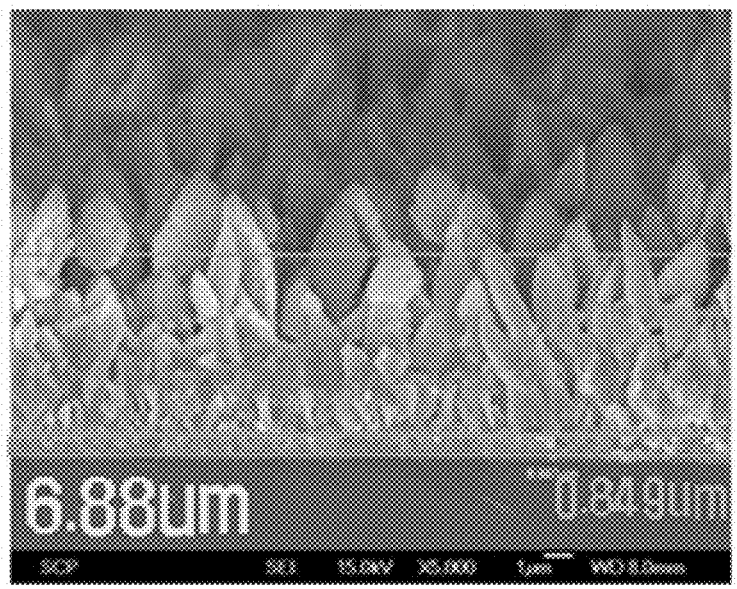
FIG. 3A, FIG. 3B, FIG. 4A, FIG. 4B, FIG. 5A and FIG. 5B are pictures of a light extraction substrate according to an embodiment of the present invention.
Figure 3B:
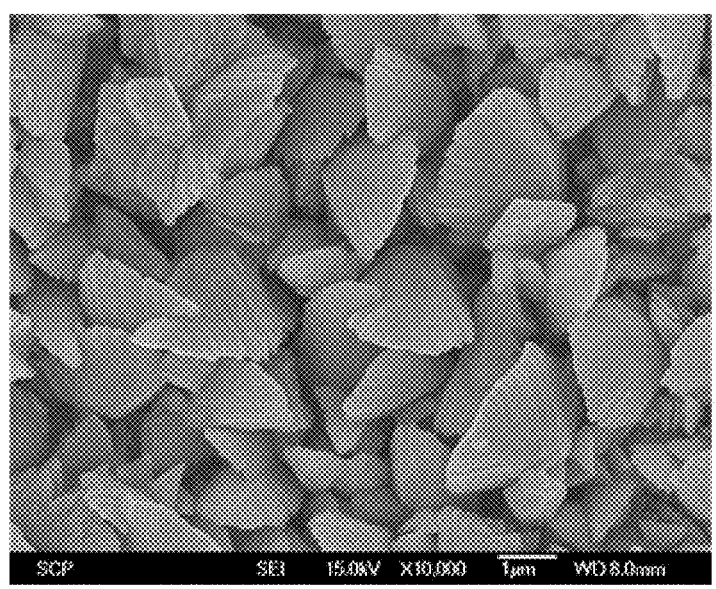
Figure 4A:
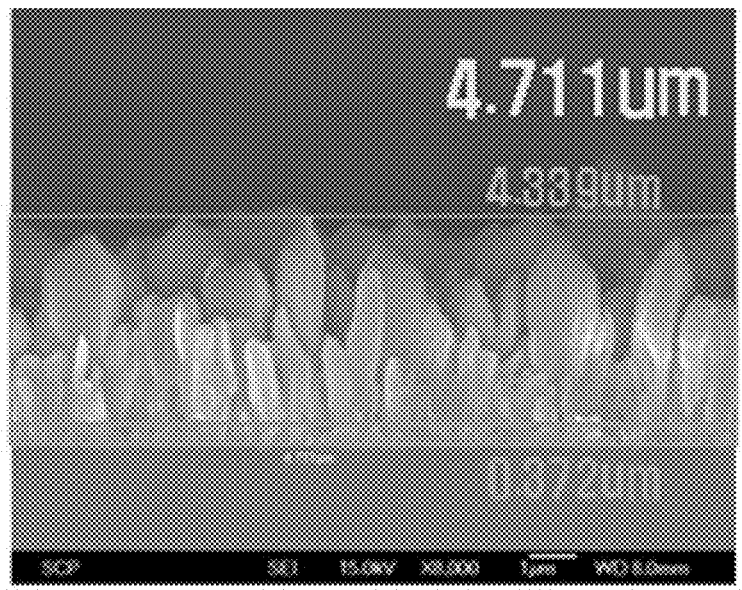
Figure 4B:
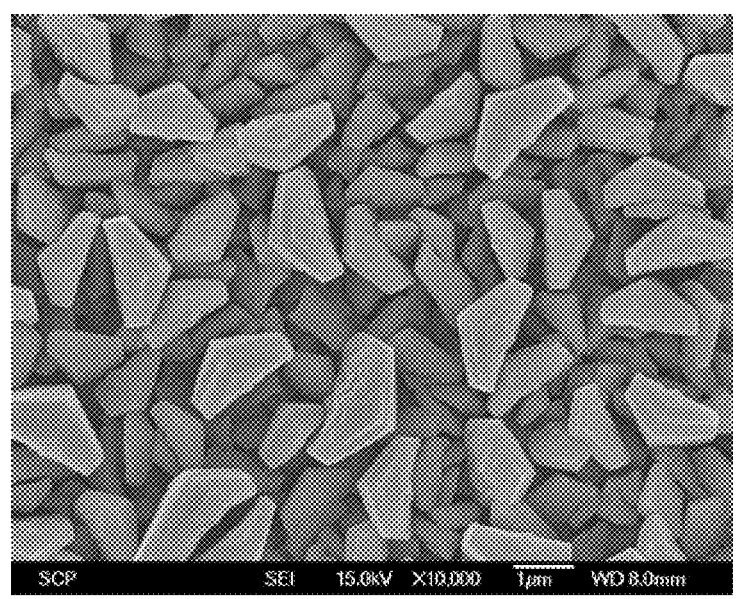
Figure 5A:
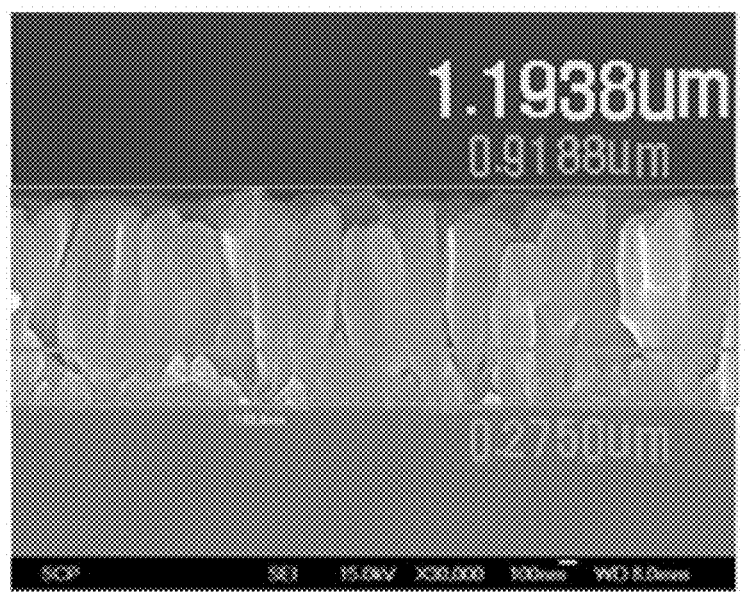
Figure 5B:
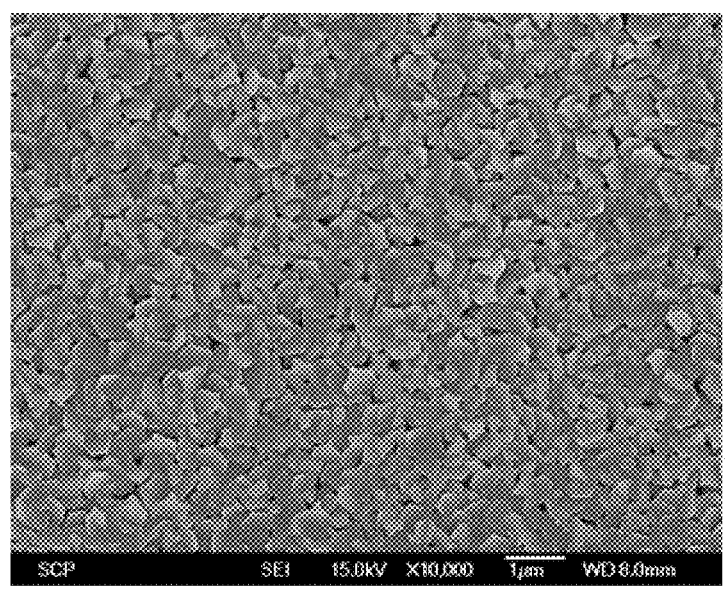

As shown in FIG. 2, the light extraction substrate for an OLED according to an embodiment of the present invention includes the substrate body 11 and the light extraction layer 100. The light extraction layer 100 includes a base layer 110, a first texture 120 and a second texture 130.

The substrate body 11 is a transparent substrate that can be made of any material as long as it has superior light transmittance and excellent mechanical properties. For instance, the substrate body 11 can be made of a polymeric material such as a thermosetting or ultraviolet (UV)-curable organic film or a chemically tempered glass such as a soda-lime glass ($SiO_2$—$CaO$—$Na_2O$) or an aluminosilicate glass ($SiO_2$—$Al_2O_3$—$Na_2O$), in which the amount of Na can be adjusted depending on the use. Here, the soda-lime glass can be used when the OLED is used for illumination, and the aluminosilicate glass can be used when the OLED is used for a display.

According to an embodiment of the present invention, the substrate body 11 can be implemented as a thin glass having a thickness of 1.5 mm or less. The thin glass is made by a fusion process or a floating process.

Referring to FIG. 3A, FIG. 3B, FIG. 4A, FIG. 4B, FIG. 5A and FIG. 5B, the base layer 110 is a lower layer of the light extraction layer 100 which adjoins the substrate 11. The base layer 110 serves to increase the light extraction efficiency by removing total internal reflection. For this, the base layer 110 may has fewer voids therein than the first texture 120. This is because the possibility of total reflection is increased by voids that are created by the air if the base layer 110 has many voids therein. The thickness of the base layer 110 is smaller than the thickness of the first texture 120. For example, the thickness of the base layer 110 is smaller than about 25% of the thickness of the first texture 120. As presented in Table 1 below, the base layer 110 can have a thickness $a_1$ ranging from 0.01 to 1.0 µm.

As shown in FIG. 3A to FIG. 5B, the first texture 120 is an upper layer of the light extraction layer 100, and is formed on the base layer 110. In addition, the first texture 120 includes a plurality of first protrusions 121 which protrude continuously or discontinuously from the base layer 110. Each of the first protrusions 121 of the first texture 120 can have a shape selected from among, but not limited to, a leaf, a rod, a hexagon, a random shape, a stacked hexagon and a hexagonal prism. As presented in Table 1 below, the height $b_1$ of the first protrusions 121 can range from 0.05 to 10 µm, the pitch $b_2$ between the adjacent first protrusions 121 can range from 0 to 10 µm, the width $b_3$ of each first protrusion 121 can range from 0.05 to 10 µm, and the width $b_4$ of each first protrusion 121 can range from 0.05 to 5 µm. Here, when viewing the first protrusion 121 from the above, the width $b_4$ indicates the shortest width of each first protrusion 121, and the width $b_3$ indicates the width orthogonal to the width $b_4$. The first texture 120 as described above serves to extract light to the outside so that the light is not totally reflected by the base layer 110 and to reflect the light to the outside depending on the size thereof.

As shown in FIG. 3A to FIG. 5B, the second texture 130 includes a plurality of second protrusions 131 which protrude continuously or discontinuously from each outer surface of the first protrusions 121 of the first texture 120. Each of the second protrusions 131 of the second texture 130 can have a shape selected from among, but not limited to, a leaf, a rod, a hexagon, a random shape, a stacked hexagon and a hexagonal prism. As presented in Table 1 below, the pitch $c_1$ of the adjacent second protrusions 131 can range from 0.01 to 1 µm, and the height $c_2$ (with reference to the paper surface) of each second protrusion 131 can range from 0.01 to 1 µm. The second texture 130 serves to enhance the scattering effect that is realized by the first texture 120.

TABLE 1

|    | µm       |
|----|----------|
| a1 | 0.01~1.0 |
| b1 | 0.05~10  |
| b2 | 0~10     |
| b3 | 0.05~10  |
| b4 | 0.05~5   |
| c1 | 0.01~1   |
| c2 | 0.01~1   |

FIG. 3A to FIG. 5B are pictures of the light extraction substrate according to an embodiment of the present invention taken using a scanning electron microscope (SEM). It can be appreciated that the base layer, the first texture and the second texture having a variety of shapes are formed on the substrate body 11.

Figure 6:
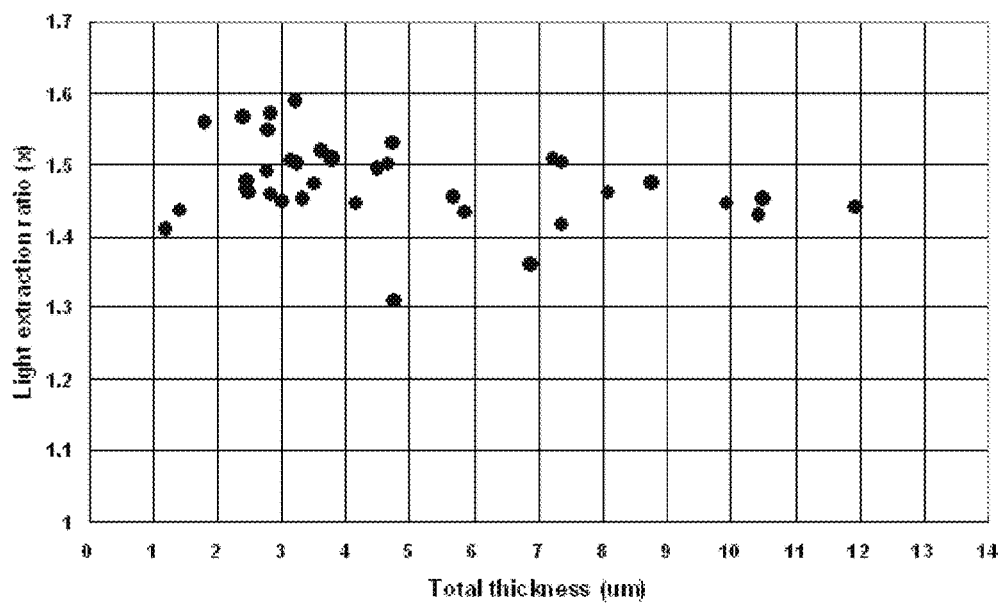
FIG. 6 is a graph showing the correlation between the entire thickness and the light extraction efficiency of a light extraction layer according to an embodiment of the present invention.
Figure 7:
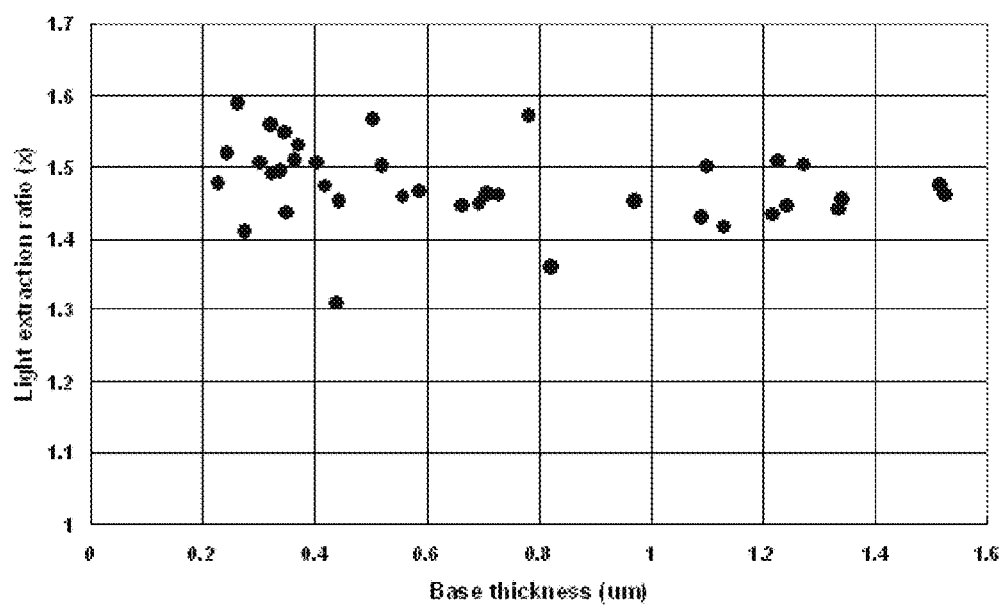
FIG. 7 is a graph showing the correlation between the thickness of a base layer and the light extraction efficiency of a light extraction layer according to an embodiment of the present invention.
Figure 8:
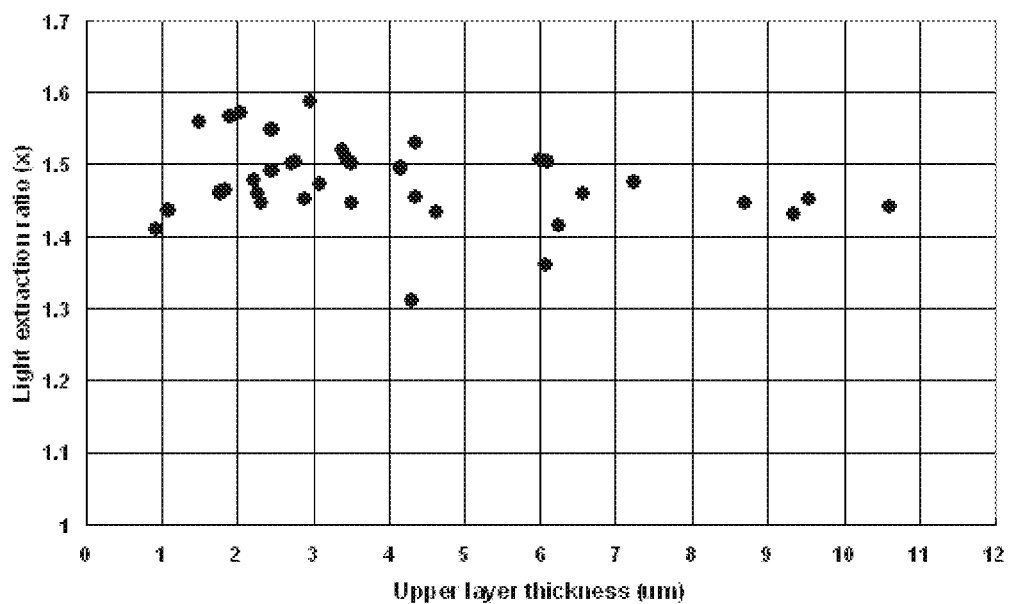
FIG. 8 is a graph showing the correlation between the thickness of a first texture and the light extraction efficiency of a light extraction layer according to an embodiment of the present invention.

FIG. 6 is a graph showing the correlation between the entire thickness and the light extraction efficiency of a light extraction layer according to an embodiment of the present invention. It can be appreciated that the light extraction efficiency is increased to about 1.4 times or greater when the thickness of the light extraction layer ranges from 1 to 12 µm. FIG. 7 is a graph showing the correlation between the thickness of a base layer (with a thickness of 0.2 µm or greater) and the light extraction efficiency of a light extraction layer according to an embodiment of the present invention. However, when the thickness of the base layer is 0.2 µm or greater, variations in the light extraction efficiency are not significant. However, the light extraction layer should have an even thin base layer since it has no effect of removing total reflection without the base layer. Accordingly, it can be understood that the thickness of the base layer in the light extraction layer including the base layer and the first texture is a factor that does not have a significant influence on the light extraction efficiency. FIG. 8 is a graph showing the correlation between the thickness of a first texture and the light extraction efficiency of a light extraction layer according to an embodiment of the present invention. It can be appreciated that the correlation between the thickness of the first texture and the light extraction efficiency of the light extraction layer shows a similar distribution to the correlation between the entire thickness and the light extraction efficiency of the light extraction layer shown in FIG. 6. It can be understood that the light extraction efficiency of the light extraction layer is determined based on the first texture and the thickness thereof.

Figure 9:
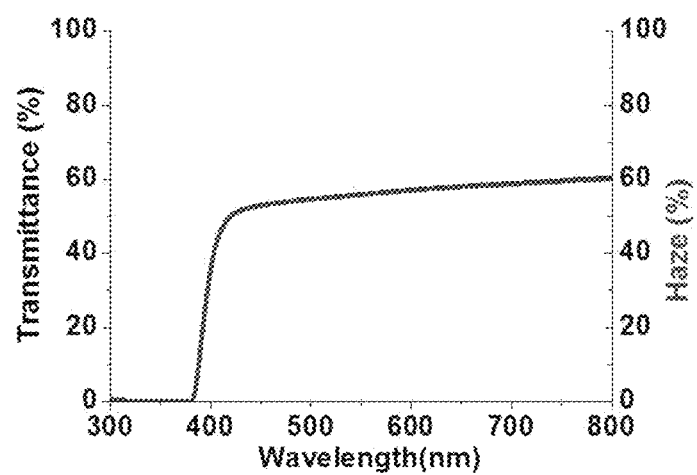
FIG. 9 and FIG. 10 are graphs showing variations in the transmittance and haze value depending on the wavelength of a light extraction substrate according to an embodiment of the present invention.
Figure 10:
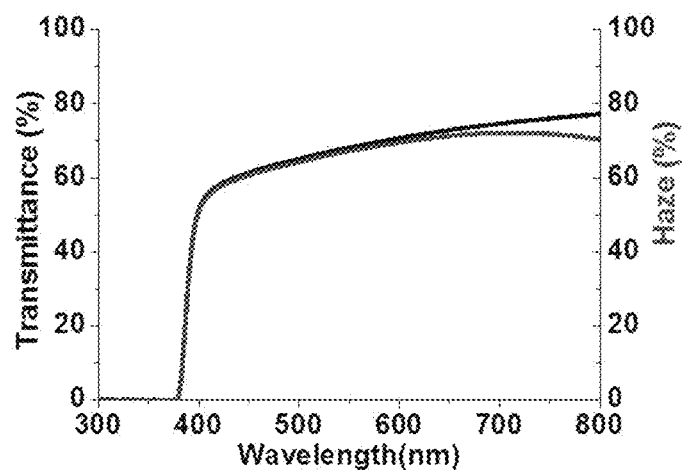
Figure 11:
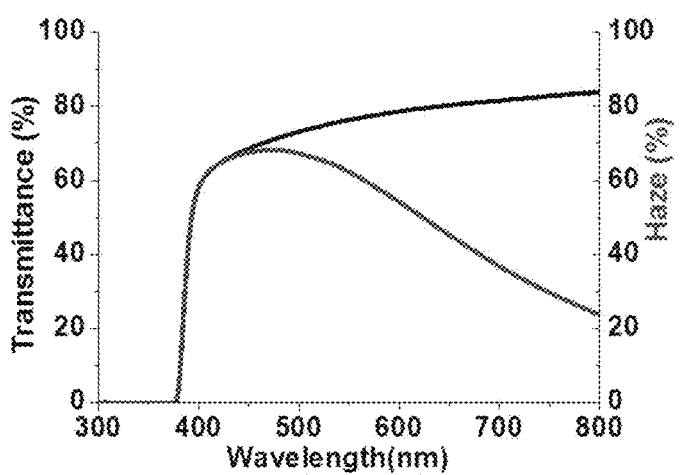
FIG. 11 and FIG. 12 are graphs showing variations in the transmittance and the haze value depending on the wavelength of a light extraction substrate of the related art.
Figure 12:
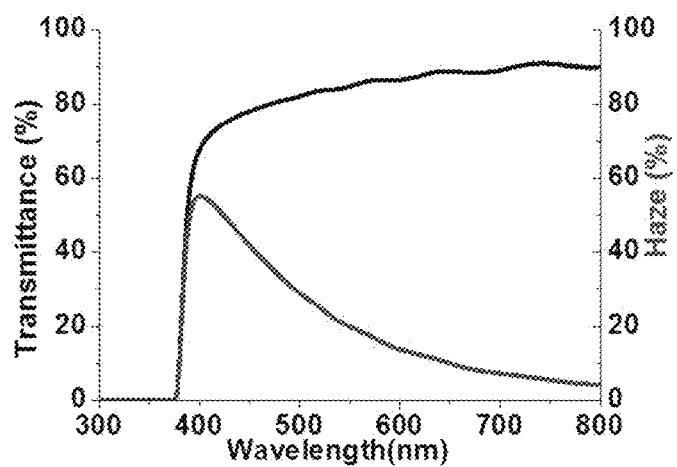

In addition, FIG. 9 and FIG. 10 are graphs showing variations in the transmittance and haze value depending on the wavelength of a light extraction substrate according to an embodiment of the present invention, and FIG. 11 and FIG. 12 are graphs showing variations in the transmittance and the haze value depending on the wavelength of a light extraction substrate of the related art. Comparing these graphs, it is appreciated that the light extraction layer according to an embodiment of the present invention shows a relatively higher haze value in the visible light wavelength range, and that an average transmittance in the visible light wavelength range, i.e. the wavelength range from 380 to 800 nm, is 40% or greater.

Reference will now be made to the method of manufacturing a light extraction substrate for an OLED according to an embodiment of the present invention. The method of manufacturing a light extraction substrate for an OLED according to an embodiment of the present invention will be described with reference to FIG. 2.

The method of manufacturing a light extraction substrate for an OLED according to an embodiment of the present invention forms the light extraction layer 100 that includes the base layer 110, the first texture 120 and the second texture 130 on the substrate body 11 by an atmosphere pressure chemical vapor deposition (APCVD) process. When the light extraction layer 100 is formed via APCVD, the base layer 110, the first texture 120 and the second texture 130 are naturally formed on the surface of the light extraction layer 100. That is, when the light extraction layer 100 is formed via APCVD, it is possible to omit the process of forming the textures, thereby simplifying the manufacturing process. This can consequently improve productivity, thereby enabling mass production.

The APCVD process includes, first, loading the substrate body 11 into a process chamber (not shown), and the heating the substrate body 11 to a predetermined temperature. Afterwards, a precursor gas and an oxidizer gas are blown into the process chamber in order to form the light extraction layer via APCVD. It is preferable to control the precursor gas and the oxidizer gas to be fed along different paths in order to prevent the gasses from mixing before entering the process chamber. The precursor gas and the oxidizer gas can be preheated before being fed in order to promote a chemical reaction. The precursor gas can be fed on a carrier gas into the process chamber, the precursor gas being implemented as an inert gas such as nitrogen, helium or argon.

When forming the light extraction layer 100 by the APCVD process, the surface of the substrate body 11 can be reformed via plasma or chemical treatment before APCVD in order to control the shape of the textured features, i.e. the first protrusions 121 and the second protrusions 131 of the first texture 120 and the second texture 130. In addition, when forming the light extraction layer 100 by the APCVD process, the surface of the substrate body 11 can be reformed via plasma or chemical treatment after APCVD in order to control the shape of the textures, i.e. the first texture 120 and the second texture 130, and the shape of the first protrusions 121 and the second protrusions 131 of the textures.

When the APCVD process has been completed as above, a light extraction substrate for an OLED according to an embodiment of the present invention is manufactured.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A light extraction substrate for an organic light-emitting device comprising an oxide or nitride thin film formed on a substrate body, wherein the oxide or nitride thin film comprises:
   a base layer formed on the substrate body;
   a first texture formed on the base layer, the first texture comprising a plurality of first protrusions which protrude continuously or discontinuously from the base layer; and
   a second texture comprising a plurality of second protrusions which protrude continuously or discontinuously from each outer surface of the first protrusions,
   wherein the base layer has fewer voids therein than the first texture,
   wherein the oxide or nitride thin film comprises a material selected from the group consisting of ZnO, TiO2, SnO2, SrTiO3, VO2, V2O3, SrRuO3, TiN, and mixtures thereof,
   wherein a thickness of the oxide or nitride thin film ranges from 1 to 12 μm,
   wherein a thickness of the base layer ranges from 0.01 to 1 μm,
   wherein a height of the first protrusions ranges from 0.05 to 10 μm, and
   wherein a thickness of the base layer is 25% or less of a thickness of the first texture.

2. The light extraction substrate of claim 1, wherein a refractive index of the oxide or nitride thin film is greater than a refractive index of the substrate body.

3. The light extraction substrate of claim 1, wherein the oxide or nitride thin film comprises a dopant of at least one selected from a metal group consisting of Mg, Cd, S, Se, Te, F, Ga, Al, Mn, Co, Cu, Nb, Nd, Sr, W and Fe.

4. The light extraction substrate of claim 1, comprising an average transmittance of 40% or greater in a wavelength range from 380 to 800 nm.

5. The light extraction substrate of claim 1, wherein a pitch of the first protrusions is 10 μm or less.

6. The light extraction substrate of claim 1, wherein the shortest width of each first protrusion ranges from 0.05 to 5 μm, and the orthogonal width to the shortest width of each first protrusion ranges from 0.05 to 10 μm.

7. The light extraction substrate of claim 1, wherein the first protrusions have a shape selected from leaf, stacked hexagon and hexagonal prism.

8. The light extraction substrate of claim 1, wherein a surface of the base layer above which the first texture protrudes has a wave-like appearance.

9. The light extraction substrate of claim 1, wherein a pitch of the second protrusions ranges from 0.01 to 1 μm, and a height of the second protrusions ranges from 0.01 to 1 μm.

10. A method of manufacturing a light extraction substrate, comprising:
   forming a light extraction layer comprising an oxide or nitride thin film on a substrate body via atmospheric pressure chemical vapor deposition, the light extraction layer comprising an oxide or nitride thin film, wherein the light extraction layer includes:

a base layer on the substrate body;
a first texture formed on the base layer, the first texture having a plurality of first protrusions which protrude continuously or discontinuously from the base layer; and
a second texture having a plurality of second protrusions which protrude continuously or discontinuously from each outer surface of the first protrusions,
wherein the base layer has fewer voids therein than the first texture,
wherein the oxide or nitride thin film comprises a material selected from the group consisting of ZnO, TiO2, SnO2, SrTiO3, VO2, V2O3, SrRuO3, TiN, and mixtures thereof,
wherein a thickness of the oxide or nitride thin film ranges from 1 to 12 µm,
wherein a thickness of the base layer ranges from 0.01 to 1 µm,
wherein a height of the first protrusions ranges from 0.05 to 10 µm, and
wherein a thickness of the base layer is 25% or less of a thickness of the first texture.

11. The method of claim 10, further comprising treating the substrate body with plasma or a chemical before forming the light extraction layer via atmospheric pressure chemical vapor deposition.

12. The method of claim 10, further comprising treating the light extraction layer with plasma or a chemical after forming the light extraction layer via atmospheric pressure chemical vapor deposition.

13. The method of claim 10, wherein a pitch of the second protrusions ranges from 0.01 to 1 µm, and a height of the second protrusions ranges from 0.01 to 1 µm.

* * * * *